United States Patent
Zhang et al.

(10) Patent No.: US 10,319,290 B2
(45) Date of Patent: Jun. 11, 2019

(54) ELECTROLUMINESCENT DEVICE, MANUFACTURING METHOD AND DRIVING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xiaojin Zhang, Beijing (CN); Xiang Feng, Beijing (CN); Dini Xie, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 107 days.

(21) Appl. No.: 15/321,892

(22) PCT Filed: Apr. 14, 2016

(86) PCT No.: PCT/CN2016/079258
§ 371 (c)(1),
(2) Date: Dec. 23, 2016

(87) PCT Pub. No.: WO2016/206448
PCT Pub. Date: Dec. 29, 2016

(65) Prior Publication Data
US 2017/0193897 A1    Jul. 6, 2017

(30) Foreign Application Priority Data
Jun. 26, 2015   (CN) .......................... 2015 1 0369486

(51) Int. Cl.
*G09G 3/14* (2006.01)
*H01L 27/32* (2006.01)
(Continued)

(52) U.S. Cl.
CPC ............. *G09G 3/3208* (2013.01); *G09G 3/14* (2013.01); *H01L 27/3206* (2013.01);
(Continued)

(58) Field of Classification Search
CPC ......... G09G 3/3208; G09G 2320/0233; G09G 2320/0666; H01L 51/56; H01L 51/5221;
(Continued)

(56) References Cited

U.S. PATENT DOCUMENTS

2008/0108270 A1* 5/2008 Hama ................. H01L 27/3209
445/24
2009/0001882 A1   1/2009 Park et al.
(Continued)

FOREIGN PATENT DOCUMENTS

CN        101908531 A   12/2010
CN        103247656 A    8/2013
(Continued)

OTHER PUBLICATIONS

Second Office Action dated Mar. 8, 2017 in corresponding Chinese Application No. 201510369486.0.
(Continued)

*Primary Examiner* — Alexander Eisen
*Assistant Examiner* — Kebede T Teshome
(74) *Attorney, Agent, or Firm* — Nath, Goldberg & Meyer; Joshua B. Goldberg

(57) ABSTRACT

The present invention provides an electroluminescent device, a manufacturing method and driving method thereof, and a display device. The electroluminescent device comprises a transparent substrate, and a first light emitting unit
(Continued)

and a second light emitting unit disposed at both sides of the transparent substrate respectively, wherein the first light emitting unit and the second light emitting unit have the same light output direction and are connected to two control circuit respectively. In the present invention, a parallel device structure is adopted to achieve independent control of two light emitting units in a single electroluminescent device, not only the color temperature is adjustable, but also the light emitting efficiency of the device can be increased. Also the transparent substrate can be fabricated using polymers having a refractive index adapted to the light emitting material, thereby reducing the optical waveguide loss in the device and realizing display of flexible device.

16 Claims, 1 Drawing Sheet

(51) Int. Cl.
| | |
|---|---|
| *H01L 51/00* | (2006.01) |
| *H01L 51/50* | (2006.01) |
| *H01L 51/52* | (2006.01) |
| *H01L 51/56* | (2006.01) |
| *G09G 3/3208* | (2016.01) |

(52) U.S. Cl.
CPC ...... *H01L 27/3209* (2013.01); *H01L 27/3267* (2013.01); *H01L 51/0096* (2013.01); *H01L 51/5206* (2013.01); *H01L 51/5221* (2013.01); *H01L 51/56* (2013.01); *G09G 2320/0233* (2013.01); *G09G 2320/0666* (2013.01); *H01L 51/005* (2013.01); *H01L 51/006* (2013.01); *H01L 51/0056* (2013.01); *H01L 51/0058* (2013.01); *H01L 51/0072* (2013.01); *H01L 51/0078* (2013.01); *H01L 51/0081* (2013.01); *H01L 51/0085* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/308* (2013.01); *H01L 2251/5307* (2013.01); *H01L 2251/5315* (2013.01); *H01L 2251/558* (2013.01)

(58) Field of Classification Search
CPC ............ H01L 51/5206; H01L 51/0096; H01L 51/005; H01L 51/0072; H01L 51/0078; H01L 51/5072; H01L 51/5056; H01L 51/5088; H01L 51/0085; H01L 51/0081; H01L 51/0056; H01L 51/0058; H01L 51/006
See application file for complete search history.

(56) References Cited

U.S. PATENT DOCUMENTS

| | | | |
|---|---|---|---|
| 2009/0021155 A1* | 1/2009 | Oda | H01L 51/50 313/504 |
| 2011/0018023 A1* | 1/2011 | Mikami | H01L 51/5268 257/98 |
| 2011/0095702 A1* | 4/2011 | Lee | H01L 27/3202 315/294 |
| 2013/0052573 A1* | 2/2013 | Sasaki | G03G 15/75 430/56 |
| 2013/0181242 A1* | 7/2013 | Cho | H01L 51/0096 257/98 |
| 2013/0200380 A1 | 8/2013 | Chang et al. | |
| 2016/0043332 A1* | 2/2016 | Yersin | H01L 51/0091 438/99 |
| 2016/0064682 A1* | 3/2016 | Yamae | H01L 51/5044 257/40 |

FOREIGN PATENT DOCUMENTS

| | | | |
|---|---|---|---|
| CN | 103346164 A | * | 10/2013 |
| CN | 104183579 A | | 12/2014 |
| CN | 105140410 A | | 12/2015 |
| KR | 10-1326429 B1 | | 11/2013 |

OTHER PUBLICATIONS

International Search Report dated Jul. 20, 2016 issued on corresponding International Application No. PCT/US2016/079258 along with English translation of the Written Opinion of the International Searching Authority.
First Office Action dated Oct. 24, 2016 in corresponding Chinese Application No. 201510369486.0.

* cited by examiner

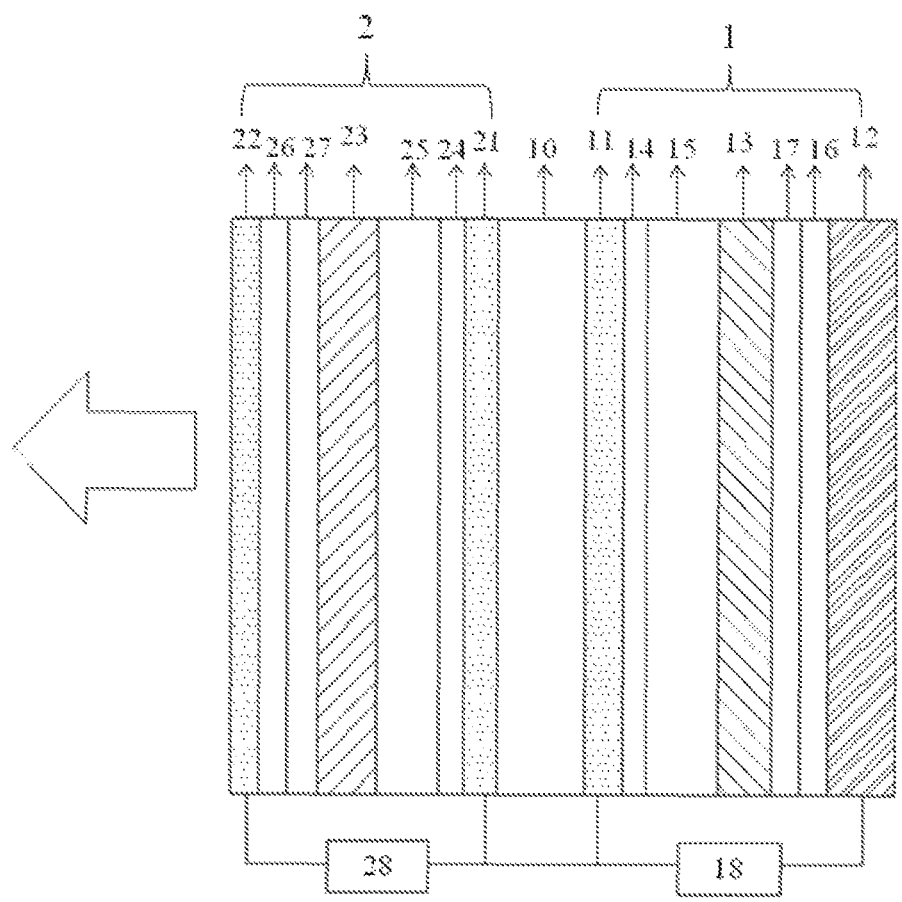

ELECTROLUMINESCENT DEVICE, MANUFACTURING METHOD AND DRIVING METHOD THEREOF, AND DISPLAY DEVICE

This is a National Phase Application filed under 35 U.S.C. 371 as a national stage of PCT/CN2016/079258, filed Apr. 14, 2016, an application claiming the benefit of Chinese Application No. 201510369486.0, filed Jun. 26, 2015, the content of each of which is hereby incorporated by reference in its entirety.

FIELD OF THE INVENTION

The present invention relates to the field of display technology, in particular to an electroluminescent device, a manufacturing method and driving method thereof, and a display device.

BACKGROUND OF THE INVENTION

An existing electroluminescent device includes laminated type and series type. The above two types of device have the following defects due to limitation in the device structure:

Laminated type devices tend to have exciplex quenching at the layer interface, and as the brightness of the device increases, the color temperature variation becomes uncontrollable. The series type devices can hardly avoid extra power consumption caused by poor contact of the light emitting layers, and cannot achieve adjustment of white light color temperature.

Therefore, it has very important significance and application value in both display and lighting fields to realize controllable color and efficient light output in a same device structure.

SUMMARY OF THE INVENTION

An object of the present invention is to provide an electroluminescent device, a manufacturing method and driving method thereof, and a display device, which can overcome the problems of uncontrollable color temperature and low lighting efficiency in existing electroluminescent devices.

In order to solve the above technical problems, as a first aspect of the invention, an electroluminescent device is provided, which comprises:

a transparent substrate;

a first light emitting unit and a second light emitting unit disposed at both sides of the transparent substrate respectively, wherein the first light emitting unit and the second light emitting unit have the same light output direction and are connected to two control circuits respectively.

Preferably, the first light emitting unit is a bottom emitting type light emitting and the second luminous unit is a top emitting type light emitting unit.

Preferably, the first light emitting unit comprises a first transparent anode, a first light emitting layer and a total reflection cathode sequentially arranged from one side close to the transparent substrate to the other side away from the transparent substrate; the second light emitting unit comprises a second transparent anode, a second light emitting layer and a transparent cathode sequentially arranged from one side close to the transparent substrate to the other side away from the transparent substrate.

Preferably, the first transparent anode and the second transparent anode are electrically connected to each other.

Preferably, a refractive index of the transparent substrate ranges from 1.7 to 2.

Preferably, the first light emitting layer is a long wavelength organic light emitting material layer, which is capable of emitting light with a wavelength of 561-760 nm; and the second light emitting layer is a short wavelength organic light emitting material layer, which is capable of emitting light with a wavelength of 380-560 nm.

Preferably, the first light emitting layer is a yellow organic light emitting material layer, and the second light emitting layer is a blue organic light emitting material layer.

Preferably, the first light emitting unit further comprises a first hole injection layer and a first hole transport layer arranged between the first transparent anode and the first light emitting layer, and a first electron injection layer and a first electron transport layer arranged between the total reflection cathode and the first light emitting layer.

The second light emitting unit further comprises a second hole injection layer and a second hole transport layer arranged between the second transparent anode and the second light emitting layer, and a second electron injection layer and a second electron transport layer arranged between the transparent cathode and the second light emitting layer.

Preferably, the first electron injection layer and the first electron transport layer together form a first electronic auxiliary layer, and the second electron injection layer and the second electron transport layer together form a second electronic auxiliary layer.

As a second aspect of the present invention, a manufacturing method of an electroluminescent device is provided, and comprises the following steps:

providing a transparent substrate;

fabricating a first light emitting unit and a second light emitting unit on both sides of the transparent substrate respectively, wherein the first light emitting unit and the second light emitting unit having the same light output direction and are connected to two control circuits respectively.

Preferably, a material of the transparent substrate includes polyimide or a composite material of polyimide/titanium dioxide, and a thickness of the transparent substrate is 100-1000 μm.

Preferably, the step of fabricating the first light emitting unit includes:

forming a first transparent anode, a first light emitting layer and a total reflection cathode sequentially on one side of the transparent substrate.

Preferably, a material of the first transparent anode includes indium tin oxide. A thickness of the first transparent anode is 80-160 nm.

Preferably, the first light emitting layer is a yellow organic light emitting material layer made of a yellow fluorescent material or a yellow phosphorescent material, and a thickness of the first light emitting layer ranges from 20 to 50 nm.

Preferably, the total reflection cathode is a metal cathode made of any one or arbitrary alloy of magnesium, silver and aluminum, and a thickness of the total reflection cathode ranges from 80 to 200 nm.

Preferably, the manufacturing method further comprises:

a step between forming the first transparent anode and forming the first light emitting layer:

forming a first hole injection layer and a first hole transport layer; and a step between forming the first light emitting layer and forming the total reflection cathode:

forming a first electron transport layer and a first electron injection layer.

Preferably, a material for forming the first hole injection layer includes any one of copper phthalocyanine, zinc phthalocyanine, 2,3,6,7,10,11-Hexacyano-1,4,5,8,9,12-hexaazatriphenylene and 2,3,5,6-Tetrafluoro-7,7',8,8'-tetracyanoquinodimethane, and a thickness of the first hole injection layer ranges from 5 to 40 nm.

Preferably, a material for forming the first hole transport layer includes N,N'-di(1-naphthyl)-N,N'-diphenyl-1,1'-biphenyl-4,4'-diamine or 2,2',7,7'-Tetrakis(diphenylamino)-9,9'-spirobifluorene, and a thickness of the first hole transport layer ranges from 10 to 100 nm.

Preferably, the first electron injection layer and the first electron transport layer together form the first electronic auxiliary layer, a material from which the first electronic auxiliary layer is made includes: Alq3:Li or BPhen:Cs, and a thickness of the first electronic auxiliary layer ranges from 10 to 100 nm.

Preferably, the step of forming the second light emitting unit includes:

forming a second transparent anode, a second light emitting layer and a transparent cathode sequentially on the other side of the transparent substrate.

Preferably, a material for forming the second transparent anode comprises indium tin oxide, and a thickness of the second transparent anode ranges from 80 to 160 nm.

Preferably, the second light emitting layer is a blue organic light emitting material layer made of a blue fluorescent material or a blue phosphorescent material, the thickness of the second light emitting layer ranges from 20 to 50 nm.

Preferably, the transparent cathode is made of any one of lithium fluoride, aluminum, indium tin oxide and lithium, or a composite material of lithium/indium tin oxide.

When the transparent cathode is made of lithium fluoride, a thickness of the transparent cathode ranges from 0.5 to 1 nm;

when the transparent cathode is made of aluminum, the thickness of the transparent cathode ranges from 1 to 3 nm;

when the transparent cathode is made of lithium, the thickness of the transparent cathode ranges from 0.5 to 1.5 nm; and when the transparent cathode is made of indium tin oxide or the composite material of lithium/indium tin oxide, the thickness of the transparent cathode ranges from 2.0 to 50 nm.

Preferably, the manufacturing method further comprises:

a step between forming the second transparent anode and forming the second light emitting layer:

forming a second hole injection layer and a second hole transport layer; and a step between forming the second light emitting layer and forming the transparent cathode:

forming a second electron transport layer and a second electron injection layer.

Preferably, a material for forming the second hole injection layer includes any one zinc of copper phthalocyanine, phthalocyanine, 2,3,6,7,10,11-Hexacyano-1,4,5,8,9,12-hexaazatriphenylene and 3,5,6-Tetrafluoro-7,7',8,8'-tetracyanoquinodimethane, and a thickness of the second hole injection layer ranges from 5 to 40 nm.

Preferably, a material for forming the second hole transport layer includes N,N'-di(naphthyl)-N,N'-diphenyl-1,1'-biphenyl-4,4'-diamine or 2,2',7,7'-Tetrakis(diphenylamino)-9,9'-spirobifluorene, and a thickness of the second hole transport layer ranges from 10 to 100 nm.

Preferably, the second electron injection layer and the second electron transport layer together form the second electronic auxiliary layer, a material from which the second electronic auxiliary layer is made includes: Alq3:Li or BPhen:Cs, and a thickness of the second electronic auxiliary layer ranges from 10 to 100 nm.

As a third aspect of the present invention, a display device is provided. The display device comprises a plurality of pixel units, each pixel unit is provided with an electroluminescent device discussed above, each pixel unit is further provided with two control circuits independent to each other, the two control circuits in one pixel unit are configured for controlling the first light emitting device and the second light emitting device to emit light, respectively.

As a fourth aspect of the present invention, a driving method of the electroluminescent device mentioned above is provided. The driving method comprises:

driving the first light emitting device to emit light through a first control circuit;

driving the second light emitting device to emit light through a second control circuit;

wherein the first control circuit and the second control circuit are independent to each other.

Preferably, the first light emitting unit comprises a first transparent anode, a first light emitting layer and a total reflection cathode sequentially arranged from one side close to the transparent substrate to the other side away from the transparent substrate; the second light emitting unit comprises a second transparent anode, a second light emitting layer and a transparent cathode sequentially arranged from one side close to the transparent substrate to the other side away from the transparent substrate.

In the driving method, a voltage output to the first transparent anode from the first control circuit is equal to a voltage output to the second transparent anode from the second control circuit, so that the first transparent anode and the second transparent anode have the same potential.

According to the present invention, a parallel device structure is adopted to achieve independent control of two light emitting units in a single electroluminescent device, so that each light emitting unit can be optimized and tuned individually. Thereby not only the color temperature is adjustable, but also the light emitting efficiency of the device can be increased. In addition, according to the present invention, the transparent substrate can be fabricated using polymers having a refractive index adapted to the light emitting material, thereby reducing the optical waveguide loss in the device and realizing display of flexible device.

BRIEF DESCRIPTION OF THE DRAWINGS

The drawings are used to provide further understanding of the present invention, constitute a part of the specification, and are used to explain the present invention together with the detailed embodiment, but not limit the present invention.

FIG. 1 is a schematic view of a structure of an electroluminescent device provided in an embodiment of the present invention.

REFERENCE NUMERALS

10—transparent substrate; 1—first light emitting unit; 2—second light emitting unit; 11—first transparent anode; 12—total reflection cathode; 13—first light emitting layer; 14—first hole injection layer; 15—first hole transport layer; 16—first electron injection layer; 17—first electron transport layer; 18—first control circuit; 21—second transparent anode 22—transparent cathode; 23—second light emitting layer; 24—second hole injection layer 25—second hole transport layer; 26—second electron injection layer; 27—second electron transport layer; 28—second control circuit.

DETAILED DESCRIPTION OF THE EMBODIMENTS

Hereinafter embodiment of the present invention will be described with reference to the accompanying drawings. It should be understood that the embodiments described herein are intended to illustrate and explain the present invention, rather than limit the present invention.

The present invention provides an electroluminescent device as shown in FIG. 1, which comprises a transparent substrate 10, and a first light emitting unit 1 and a second light emitting unit 2 disposed at both sides of the transparent substrate 10 respectively, and the first light emitting unit 1 and the second light emitting unit 2 have the same light output direction and are connected to two control circuits respectively.

For example, in FIG. 1, the first light emitting unit 1 and the second light emitting unit 2 are controlled respectively by a first control circuit 18 and a second control circuit 28 independent to each other. The light output direction is the direction along which the light transmits through the transparent substrate 10, as indicated by the hollow arrow in FIG. 1. Depending on the specific structure of the first light emitting unit 1 and the second light emitting unit 2, the light incidence direction may be opposite to that shown in FIG. 1, the details of which are omitted here.

According to the present invention, a parallel device structure is adopted to achieve independent control of two light emitting units in a single electroluminescent device. For a white electroluminescent device, light emitted by the two light emitting units superimposes to generate white light. According to the present invention, the two light emitting units are optimized and tuned respectively, so that not only the color temperature of the white light is adjustable, but also the light emitting efficiency of the device can be increased.

Here the optimization and tuning refer to selecting the material for the respective layers in the light emitting unit and configuring the properties thereof, so that the light emitted by the two light emitting units is mixed in color, and tuning the output brightness and color coordinate distribution properties of the two light emitting units by independent driving, so that the color temperature of the output light is adjustable.

The specific direction along which the transparent substrate 10, the first light emitting unit 1 and the second light emitting unit 2 are stacked is not limited in the present invention. In FIG. 1, for example, the transparent substrate 10, the first light emitting unit 1 and the second light emitting unit 2 are arranged in parallel with each other, and are arranged in vertical direction.

As one embodiment of the invention, the first light emitting unit 1 is a bottom emitting type light emitting unit, and the second light emitting unit 2 is a top emitting type light emitting unit, wherein the light propagates along the direction indicated by the hollow arrow in FIG. 1. Also, in the present invention the first light emitting unit 1 may be set as a top emitting type light emitting unit, and the second light emitting unit 2 may be set as a bottom emitting type light emitting unit, so that the light output direction of the electroluminescent device is changed. Taking a white electroluminescent device as an example, the only requirement is that the light emitted by first light emitting unit 1 and the second light emitting unit 2 can superimpose with each other to generate white light.

Furthermore, the first light emitting unit 1 comprises a first transparent anode 11, a first light emitting layer 13 and a total reflection cathode 12 sequentially arranged from one side close to the transparent substrate 10 to the other side away from the transparent substrate 10, so as to provide a bottom emitting type light emitting structure.

The second light emitting unit 2 comprises a second transparent anode 21, a second light emitting layer 23 and a transparent cathode 22 sequentially arranged from one side close to the transparent substrate 10 to the other side away from the transparent substrate 10, so as to provide a top emitting type light emitting structure.

Note that, the second light emitting unit 2 is actually a double-sided light-transmissive structure, this design is to make light emitted from the first light emitting unit 1 pass through the second light emitting unit 2, and superimpose with light emitted by the second light emitting unit 2, so that the light emitted by the two light emitting units is simultaneously output from the transparent cathode 22 of the second light emitting unit 2, thereby white light is achieved.

As shown in FIG. 1, the first control circuit 18 is electrically connected to the first transparent anode 11 and the total reflection cathode 12, so as to control the first light emitting unit 1 to emit light; the second control circuit 28 is electrically connected to the second transparent anode 21 and the transparent cathode 22, so as to control the second light emitting unit 2 to emit light.

In the present invention, the first control circuit 18 and the second control circuit 28 control the first light emitting unit 1 and the second light emitting unit 2 to emit light in turn, so as to reduce power consumption; alternatively, the first control circuit 18 and the second control circuit 28 control the first light emitting unit 1 and the second light emitting unit 2 to emit light simultaneously so as to provide an enhanced brightness.

When the first light emitting unit 1 and the second light emitting unit 2 emit light simultaneously, in order to prevent the capacitive effects from being formed between the transparent substrate 10 and the transparent anodes at both sides of the transparent substrate 10, preferably, the first transparent anode 11 and the second transparent anode 21 are electrically connected to each other, so that a same potential is kept on the first transparent anode 11 and the second transparent anode 21.

Further, in order to reduce the optical waveguide loss in the transparent substrate 10, in the present invention, the transparent substrate 10 may be fabricated using polymers having a refractive index adapted to the light emitting material of the two light emitting units. After experiments, the refractive index of the transparent substrate 10 preferably ranges from 1.7 to 2, thereby reducing the optical waveguide loss in the device and increasing light emitting efficiency of the device.

Preferably, the material for fabricating the transparent substrate 10 includes polyimide or polyimide/titanium dioxide composite material, and the thickness of the transparent substrate 10 is 100-1000 μm.

In the present invention, the transparent substrate 10 may be made of a flexible material, so that the electroluminescent device of the present invention has the properties of flexible display. For example, polyimide, as a flexible material, can be used to fabricate the transparent substrate 10, so that a flexible electroluminescent device can be realized.

The material for the first light emitting layer 13 and the second light emitting layer 23 is not specifically limited. Both inorganic light emitting material and organic light emitting material can be adopted for the first light emitting layer 13 and/or the second light emitting layer 23.

Specifically, in order to provide a wide range of adjustable color temperature for the electroluminescent device, the first light emitting layer 13 can be a long wave organic light emitting material layer capable of emitting light at a wavelength of 561-760 nm (i.e. covering the red and yellow light spectrum); the second light emitting layer 23 can be a short wave organic light emitting material layer capable of emitting light at a wavelength of 380-7560 nm (i.e. covering the blue and green light spectrum). Thus when light emitted from the first light emitting layer 13 and the second light emitting layer 23 are superimposed, a wide range of adjustable color temperature can be provided for the electroluminescent device.

Taking a white electroluminescent device as an example, typically, white light can be generated by superimposing blue light with yellow light. In this case, the first light emitting layer 13 can be a yellow organic light emitting material layer made of a yellow fluorescent material or a yellow phosphorescent material (e.g. CPB:(bt)Ir(acac)). The first light emitting layer 13 can be prepared by evaporation and the like, and has a thickness of 20-50 nm.

Accordingly, the second light emitting layer 23 may be a blue light organic light emitting material layer made of a blue fluorescent material or a blue phosphorescent material (e.g. CPB:FIrpic). The second light emitting layer 23 can be prepared by evaporation and the like, and has a thickness of 20-50 nm.

If the electroluminescent light emitting device is not required to produce a white light, light emitting materials of other colors can be also adopted for the first light emitting layer 13 and the second light emitting layer 23. For example, the second light emitting layer 23 may be a green light organic light emitting material layer made of CPB:Ir(ppy)$_3$, the details of which are omitted here.

Preferably, the material for fabricating the first transparent anode 11 and/or the second transparent anode 21 includes indium tin oxide (ITO). The first transparent anode 11 and/or the second transparent anode 21 can be prepared by magnetical sputtering. The thickness of the first transparent anode 11 and/or the second transparent anode 21 is 80-160 nm, preferably 100 nm.

Preferably, the total reflection cathode 12 is a metal cathode made of any one or arbitrary alloy of magnesium, silver and aluminum (e.g. Mg:Ag or Al), which can be prepared by evaporation and the like. The thickness of the total reflection cathode 12 ranges from 80 to 200 nm.

Preferably, the transparent cathode 22 is made of any one of lithium fluoride (LiF), aluminum (Al), indium tin oxide (ITO) and lithium (Li), or a composite of lithium/indium tin oxide (Li/ITO), wherein when the transparent cathode 22 is made of lithium fluoride, the thickness of the transparent cathode 22 ranges from 0.5 to 1 nm, preferably 0.5 nm;

when the transparent cathode 22 is made of aluminum, the thickness of the transparent cathode 22 ranges from 1 to 3 nm;

when the transparent cathode 22 is made of lithium, the thickness of the transparent cathode 22 ranges from 0.5 to 1.5 nm, preferably 1 nm;

when the transparent cathode 22 is made of indium tin oxide or a composite material of lithium/indium tin oxide, the thickness of the transparent cathode 22 ranges from 20 to 50 nm.

Note that, in order to improve the light emitting efficiency and brightness of the electroluminescent light emitting device, the transmittance of the transparent cathode 22 should preferably reach 80%-90%.

As shown in FIG. 1, the first light emitting unit 1 further comprises a first hole injection layer 14 and a first hole transport layer 15 arranged between the first transparent anode 11 and the first light emitting layer 13, and a first electron injection layer 16 and a first electron transport layer 17 arranged between the total reflection cathode 12 and the first light emitting layer 13.

The second light emitting unit 2 further comprises a second hole injection layer 24 and a second hole transport layer 25 arranged between the second transparent anode 21 and the second light emitting layer 23, and a second electron injection layer 26 and a second electron transport layer 27 arranged between the transparent cathode 22 and the second light emitting layer 23.

The first hole injection layer 14 is configured for modifying the first transparent anode 11, thereby improving the efficiency of hole injection and modifying the defects on the surface of the first transparent anode 11. Similarly, the second hole injection layer 24 is configured for modifying the second transparent anode 21, thereby improving the efficiency of hole injection and modifying the defects on the surface of the second transparent anode 21.

Preferably, a material for forming the first hole injection layer 14 and/or the second hole injection layer 24 includes any one of copper phthalocyanine (CuPc), zinc phthalocyanine (ZnPc), 2,3,6,7,10,11-Hexacyano-1,4,5,8,9,12-hexaazatriphenylene (HAT-CN) and 2,3,5,6-Tetrafluoro-7,7',8,8'-tetracyanoquinodimethane (a-NPD:F$_4$-TCNQ). The thickness of the first hole injection layer 14 is set in a range of 5-40 nm, and the thickness of the second hole injection layer 24 is set in a range of 5-40 nm.

The first hole transport layer 15 is an energy level matching layer which can promote the holes being transferred into the first light emitting layer 13. Similarly, the second hole transport layer 25 is an energy level matching layer which can promote the holes being transferred into the second light emitting layer 23.

Preferably, a material for forming the first hole transport layer 15 and/or the second hole transport layer 25 includes any one of N,N'-di(1-naphthyl)-N,N'-diphenyl-1,1'-biphenyl-4,4'-diamine (NPB) or 2,2',7,7'-Tetrakis(diphenylamino)-9,9'-spirobifluorene (Spiro-TAD). The thickness of the first hole transport layer 15 and/or the second hole transport layer 25 is set in a range of 10-100 nm.

In the present invention, the first electron injection layer 16 and the first electron transport layer 17 together form a first electronic auxiliary layer, the second electron injection layer 26 and the second electron transport layer 27 together form a second electronic auxiliary layer. The first electronic auxiliary layer and the second electronic auxiliary layer have the function of reducing the interface barrier to the electron in transmission.

Preferably, a material from which the first electronic auxiliary layer and/or the second electronic auxiliary layer are made includes: Alq3:Li or BPhen:Cs. The thickness of the first electronic auxiliary layer and/or the second electronic auxiliary layer ranges from 10 to 100 nm.

The present invention also provides a manufacturing method of an electroluminescent device, which comprises the following steps:

providing a transparent substrate;

fabricating the first light emitting unit and the second light emitting unit on both sides of the transparent substrate respectively, wherein the first light emitting unit and the second light emitting unit having the same lighting direction and are connected to two control circuits respectively.

According to the present invention, a parallel device structure is adopted to achieve independent control of two light emitting units in a single electroluminescent light emitting device, so that each light emitting unit can be optimized and tuned individually. Thereby not only the color temperature is adjustable, but also the light emitting efficiency of the device can be increased. In addition, according to the present invention, the transparent substrate can be fabricated using polymers having a refractive index adapted to the light emitting material, thereby reducing the optical waveguide loss in the device and realizing display of a flexible device.

Preferably, a material for fabricating the transparent substrate includes polyimide or a composite material of polyimide/titanium dioxide, and the thickness of the transparent substrate is 100-1000 µm.

Preferably, the step of fabricating the first light emitting unit includes:

forming a first transparent anode, a first light emitting layer and a total reflection cathode sequentially on one side of the transparent substrate.

Preferably, a material for fabricating the first transparent anode includes indium tin oxide. A thickness of the first transparent anode is 80-160 nm.

Preferably, the first light emitting layer is a yellow light organic light emitting material layer made of yellow fluorescent material or yellow phosphorescent material, the thickness of the first light emitting layer ranges from 20 to 50 nm.

Preferably, the total reflection cathode is a metal cathode made of any one or arbitrary alloy of magnesium, silver and aluminum, and a thickness of the total reflection cathode ranges from 80 to 200 nm.

Preferably, the manufacturing method further comprises:

a step between forming the first transparent anode and forming the first light emitting layer:

forming a first hole injection layer and a first hole transport layer; and a step between forming the first light emitting layer and forming the total reflection cathode:

forming a first electron transport layer and a first electron injection layer.

Preferably, a material for forming the first hole injection layer includes any one of copper phthalocyanine, zinc phthalocyanine, 2,3,6,7,10,11-Hexacyano-1,4,5,8,9,12-hexaazatriphenylene and 2,3,5,6-Tetrafluoro-7,7',8,8'-tetracyanoquinodimethane, and a thickness of the first hole injection layer ranges from 5 to 40 nm.

Preferably, a material for forming the first hole transport layer includes N,N'-di(1-naphthyl)-N,N'-diphenyl-1,1'-biphenyl-4,4-diamine or 2,2',7,7'-Tetrakis(diphenylamino)-9,9'-spirobifluorene, and a thickness of the first hole transport layer ranges from 10 to 100 nm.

Preferably, the first electron injection layer and the first electron transport layer together form a first electronic auxiliary layer, the material from which the first electronic auxiliary layer is made includes: Alq3:Li or BPhen:Cs, a thickness of the first electronic auxiliary layer ranges from 10 to 100 nm.

Preferably, the step of forming the second light emitting unit includes:

forming a second transparent anode, a second light emitting layer and a transparent cathode sequentially on the other side of the transparent substrate.

Preferably, a material for forming the second transparent anode comprises indium tin oxide, and a thickness of the second transparent anode ranges from 80 to 160 nm.

Preferably, the second light emitting layer is a blue organic light emitting material layer made of a blue fluorescent material or a blue phosphorescent material, and a thickness of the second light emitting layer ranges from 20 to 50 nm.

Preferably, the transparent cathode is made of any one of lithium fluoride, aluminum, indium tin oxide and lithium, or a composite material of lithium/indium tin oxide.

When the transparent cathode is made of lithium fluoride, a thickness of the transparent cathode ranges from 0.5 to 1 nm;

when the transparent cathode is made of aluminum, the thickness of the transparent cathode ranges from 1 to 3 nm;

when the transparent cathode is made of lithium, the thickness of the transparent cathode ranges from 0.5 to 1.5 nm;

when the transparent cathode is made of indium tin oxide or a composite material of lithium/indium tin oxide, the thickness of the transparent cathode ranges from 20 to 50 nm.

Preferably, the manufacturing method further comprises:

a step between forming the second transparent anode and forming the second light emitting layer:

forming a second hole injection layer and a second hole transport layer; and a step between forming the second light emitting layer and forming the transparent cathode:

forming a second electron transport layer and a second electron injection layer.

Preferably, a material for forming the second hole injection layer includes any one of copper phthalocyanine, zinc phthalocyanine, 2,3,6,7,10,11-Hexacyano-1,4,5,8,9,12-hexaazatriphenylene and 2,3,5,6-Tetrafluoro-7,7',8,8'-tetracyanoquinodimethane, and a thickness of the second hole injection layer ranges from 5 to 40 nm.

Preferably, a material for forming the second hole transport layer includes N,N'-di(1-naphthyl)-N,N'-diphenyl-1,1'-biphenyl-4,4'-diamine or 2,2',7,7'-Tetrakis(diphenylamino)-9,9'-spirobifluorene, and a thickness of the second hole transport layer ranges from 10 to 100 nm.

Preferably, the second electron injection layer and the second electron transport layer together form the second electronic auxiliary layer, a material from which the second electronic auxiliary layer is made includes: Alq3:Li or BPhen:Cs, a thickness of the second electronic auxiliary layer ranges from 10 to 100 nm.

The present invention also provides a display device. The display device comprises a plurality of pixel units, each pixel unit is provided with an electroluminescent device discussed above.

Each pixel unit is further provided with two control circuits independent to each other, the two control circuits in one pixel unit are configured for respectively controlling the first light emitting device 1 and the second light emitting device 2 to emit light. As shown in FIG. 1, the two control circuits include the first control circuit 18 for controlling the first light emitting circuit 1 and the second control circuit 28 for controlling the second light emitting circuit 2.

Taking a white electroluminescent device as an example, the fabrication procedure of an electroluminescent device according to the present invention will be described.

Firstly, ITO thin films having a thickness of about 100 nm are prepared through magnetical sputtering on both side of the transparent substrate 10 (with a thickness of 100-1000 μm) made of a polymer material, so as to form the first transparent anode 11 and the second transparent anode 21. In order to reduce the optical waveguide loss of the device and take the refractive index of the ITO and the light emitting material into consideration, the transparent substrate 10 used in the present invention should have a refractive index ranging from 1.7 to 2, and have good thermal stability, and the material can be selected from PI or a composite material of PI/TiO2.

The step of preparing the bottom emitting type light emitting unit comprises:

preparing a first hole injection layer 14 on the outside of the first transparent anode 11, the first hole injection layer 14 has functions of improving hole injection efficiency and modifying defects in the ITO layer, wherein the first hole injection layer 14 can be made of a material such as CuPc, ZnPc, HAT-CN, a-NPD:$F_4$-TCNQ, by evaporation or a coating method, and a thickness thereof is set in a range of 5-40 nm;

preparing a first hole transport layer 15 on the outside of the first hole injection layer 14, the first hole transport layer 15 has a function to promote holes being transferred into the light emitting layer, wherein the first hole transport layer 15 can be made of a material such as NPB, Spiro-TAD, and a thickness thereof is set in a range of 10-100 nm;

preparing a first light emitting layer 13 on the outside of the first hole transport layer 15, the first light emitting layer 13 can be made of a yellow organic light emitting material such as CPB:(bt)Ir(acac), and a thickness thereof is set in a range of 20-50 nm;

preparing a first electronic auxiliary layer (a combination of the first electron injection layer 16 and the first electron transport layer 17) on the outside of the first light emitting layer 13 to reduce the interface barrier to the electron in transmission, wherein the first electronic auxiliary layer can be made of a material such as Alq3:Li, BPhen:Cs, and has a conductivity of preferably $10^{-5}$ S/cm, and a thickness set in a range of 10-100 nm;

preparing a total reflection cathode 12 on the outside of the first electronic auxiliary layer, the total reflection cathode 12 can be formed by evaporation using Mg:Ag or Al, and has a thickness set in a range of 80-200 nm.

The step of preparing the top emitting type light emitting unit comprises:

preparing a second hole injection layer 24 on the outside of the second transparent anode 22, the second hole injection layer 24 has functions of improving hole injection efficiency and modifying defects in the ITO layer, wherein the second hole injection layer 24 can be made of a material such as CuPc, ZnPc, HAT-CN, a-NPD:$F_4$-TCNQ, by evaporation or coating method, and a thickness thereof is set in a range of 5-40 nm;

preparing a second hole transport layer 25 on the outside of the second hole injection layer 24, the second hole transport layer 25 has a function to promote holes being transferred into the light emitting layer, wherein the second hole transport layer 25 can be made of a material such as NPB, Spiro-TAD, and a thickness thereof is set in a range of 10-100 nm;

preparing a second light emitting layer 23 on the outside of the second hole transport layer 25, the second light emitting layer 23 can be made of a blue organic light emitting material such as CBP:FIrpic through evaporation, and a thickness thereof is set in a range of 20-50 nm;

preparing a second electronic auxiliary layer (a combination of the second electron injection layer 26 and the second electron transport layer 27) on the outside of the second light emitting layer 23 to reduce the interface barrier to the electron in transmission, wherein the second electronic auxiliary layer can be made of a material such as Alq3:Li, BPhen:Cs, and has a conductivity of preferably $20^{-5}$ S/cm, and a thickness set in a range of 10-100 nm;

preparing a transparent cathode 22 on the outside of the second electronic auxiliary layer, the transparent cathode 22 can be made of LiF (preferably having a thickness of 0.5 nm), Al (preferably having a thickness of 1-3 nm), ITO (preferably having a thickness of 20-50 nm) or a composite material of Li/ITO (preferably having a thickness of 20-50 nm), and a transmittance of the transparent cathode 22 should preferably reach 80%-90%.

The electroluminescent device fabricated with the above method cooperates with the first control circuit 18 and the second control circuit 28 independent to each other and provides outside to achieve white light output with high luminous efficiency and adjustable color temperature.

The present invention also provides a driving method of the electroluminescent light emitting device mentioned above. The driving method comprises:

driving the first light emitting device to emit light through a first control circuit;

driving the second light emitting device to emit light through a second control circuit;

wherein the first control circuit and the second control circuit are independent to each other.

Preferably, the first light emitting unit comprises a first transparent anode, a first light emitting layer and a total reflection cathode sequentially arranged from one side close to the transparent substrate to the other side away from the transparent substrate; the second light emitting unit comprises a second transparent anode, a second light emitting layer and a transparent cathode sequentially arranged from one side close to the transparent substrate to the other side away from the transparent substrate.

In order to prevent the capacitive effects from being formed between the transparent substrate and the transparent anodes at both sides of the transparent substrate, in the driving method:

a voltage output to the first transparent anode from the first control circuit is equal to a voltage output to the second transparent anode from the second control circuit, so that the first transparent anode and the second transparent anode have the same potential.

It should be understood that above embodiments are only exemplary embodiments for illustrating the principle of the present invention; however, the present invention is not limited thereto. Various variations and improvements can be made by persons skilled in the art without departing from the spirit and essence of the present invention, and these variations and improvements should also be considered to be within the protection scope of the present invention.

The invention claimed is:

1. An electroluminescent device, comprising:
   a transparent substrate;
   a first light emitting unit and a second light emitting unit disposed at both sides of the transparent substrate, respectively, wherein the first light emitting unit and the second light emitting unit have a same light output direction and are connected to two control circuits, respectively, and the transparent substrate has a refractive index adapted to light emitting materials of the first light emitting unit and the second light emitting unit, the first light emitting unit is a bottom emitting type light emitting unit, and the second light emitting unit is a top emitting type light emitting unit;

the first light emitting unit comprises a first transparent anode, a first light emitting layer and a total reflection cathode sequentially arranged from one side close to the transparent substrate to the other side away from the transparent substrate; the second light emitting unit comprises a second transparent anode, a second light emitting layer and a transparent cathode sequentially arranged from one side close to the transparent substrate to the other side away from the transparent substrate; and the first transparent anode and the second transparent anode are directly electrically connected to each other.

2. The electroluminescent device according to claim 1, wherein the refractive index of the transparent substrate ranges from 1.7 to 2.

3. The electroluminescent device according to claim 1, wherein the first light emitting layer is a long wavelength organic light emitting material layer, which is capable of emitting light with a wavelength of 561-760 nm; and the second light emitting layer is a short wavelength organic light emitting material layer, which is capable of emitting light with a wavelength of 380-560 nm.

4. The electroluminescent device according to claim 3, wherein the first light emitting layer is a yellow organic light emitting material layer, and the second light emitting layer is a blue organic light emitting material layer.

5. The electroluminescent device according to claim 1, wherein the first light emitting unit further comprises a first hole injection layer and a first hole transport layer arranged between the first transparent anode and the first light emitting layer, and a first electron injection layer and a first electron transport layer arranged between the total reflection cathode and the first light emitting layer; and the second light emitting unit further comprises a second hole injection layer and a second hole transport layer arranged between the second transparent anode and the second light emitting layer, and a second electron injection layer and a second electron transport layer arranged between the transparent cathode and the second light emitting layer.

6. A manufacturing method of an electroluminescent device comprising:

providing a transparent substrate;

fabricating a first light emitting unit and a second light emitting unit on both sides of the transparent substrate, respectively, wherein the first light emitting unit and the second light emitting unit have a same light output direction and are connected to two control circuits, respectively, and the transparent substrate has a refractive index adapted to light emitting materials of the first light emitting unit and the second light emitting unit, wherein the first light emitting unit is a bottom emitting type light emitting unit, and the step of fabricating the first light emitting unit includes: forming a first transparent anode, a first light emitting layer and a total reflection cathode sequentially on one side of the transparent substrate;

the second light emitting unit is a top emitting type light emitting unit, and the step of forming the second light emitting unit comprises: forming a second transparent anode, a second light emitting layer and a transparent cathode sequentially on the other side of the transparent substrate; and the first transparent anode and the second transparent anode are directly electrically connected to each other.

7. The manufacturing method according to claim 6, wherein a material of the first transparent anode includes indium tin oxide, and a thickness of the first transparent anode is 80-160 nm.

8. The manufacturing method according to claim 6, wherein the first light emitting layer is a yellow organic light emitting material layer made of a yellow fluorescent material or a yellow phosphorescent material, and a thickness of the first light emitting layer ranges from 20 to 50 nm.

9. The manufacturing method according to claim 6, wherein the total reflection cathode is a metal cathode made of any one or arbitrary alloy of magnesium, silver and aluminum, and a thickness of the total reflection cathode ranges from 80 to 200 nm.

10. The manufacturing method according to claim 6, wherein the manufacturing method further comprises:

a step between forming the first transparent anode and forming the first light emitting layer:

forming a first hole injection layer and a first hole transport layer; and a step between forming the first light emitting layer and forming the total reflection cathode:

forming a first electron transport layer and a first electron injection layer.

11. The manufacturing method according to claim 10, wherein a material for forming the first hole injection layer includes any one of copper phthalocyanine, zinc phthalocyanine, 2,3,6,7,10,11-Hexacyano-1,4,5,8,9,12-hexaazatriphenylene and 2,3,5,6-Tetrafluoro-7,7',8,8'-tetracyanoquinodimethane, and a thickness of the first hole injection layer ranges from 5 to 40 nm.

12. The manufacturing method according to claim 10, wherein a material for forming the first hole transport layer includes N,N'-di(1-naphthyl)-N,N'-diphenyl-1,1'-biphenyl-4,4'-diamine or 2,2',7,7'-Tetrakis(diphenylamino)-9,9'-spirobifluorene, and a thickness of the first hole transport layer ranges from 10 to 100 nm.

13. The manufacturing method according to claim 10, wherein the first electron injection layer and the first electron transport layer together form a first electronic auxiliary layer, a material from which the first electronic auxiliary layer is made includes: Alq3:Li or BPhen:Cs, and a thickness of the first electronic auxiliary layer ranges from 10 to 100 nm.

14. The manufacturing method according to claim 6, wherein the transparent cathode is made of any one of lithium fluoride, aluminum, indium tin oxide and lithium, or a composite material of lithium/indium tin oxide;

when the transparent cathode is made of lithium fluoride, a thickness of the transparent cathode ranges from 0.5 to 1 nm;

when the transparent cathode is made of aluminum, the thickness of the transparent cathode ranges from 1 to 3 nm;

when the transparent cathode is made of lithium, the thickness of the transparent cathode ranges from 0.5 to 1.5 nm; and when the transparent cathode is made of indium tin oxide or the composite material of lithium/indium tin oxide, the thickness of the transparent cathode ranges from 20 to 50 nm.

15. A driving method of the electroluminescent device according to claim 1, comprising:
    driving the first light emitting device to emit light through a first control circuit;
    driving the second light emitting device to emit light through a second control circuit;
    wherein the first control circuit and the second control circuit are independent to each other.

16. The driving method according to claim 15, wherein a voltage output to the first transparent anode from the first control circuit is equal to a voltage output to the second transparent anode from the second control circuit, so that the first transparent anode and the second transparent anode have the same potential.

* * * * *